United States Patent [19]

Koker

[11] Patent Number: 5,341,033

[45] Date of Patent: Aug. 23, 1994

[54] INPUT BUFFER CIRCUIT WITH DEGLITCH METHOD AND APPARATUS

[75] Inventor: Gregory T. Koker, Arlington, Mass.

[73] Assignee: Analog Devices, Inc., Norwood, Mass.

[21] Appl. No.: 980,247

[22] Filed: Nov. 23, 1992

[51] Int. Cl.⁵ .............................................. H03K 3/295
[52] U.S. Cl. ................................... 307/290; 307/279; 307/542; 307/546
[58] Field of Search .............. 307/279, 290, 520, 542, 307/572, 354, 546, 542, 548, 549, 443

[56] References Cited

U.S. PATENT DOCUMENTS

| 4,464,587 | 8/1984 | Suzuki et al. | 307/290 |
| 4,563,594 | 1/1986 | Koyama | 307/290 |
| 5,113,098 | 5/1992 | Teymouri | 307/520 |
| 5,175,445 | 12/1992 | Kinugasa et al. | 307/290 |

FOREIGN PATENT DOCUMENTS

| 0093721 | 6/1982 | Japan | 307/290 |
| 0234616 | 10/1986 | Japan | 307/290 |
| 0064115 | 3/1991 | Japan | 307/290 |

OTHER PUBLICATIONS

Glasser et al., *The Design and Analysis of VLSI Circuits*, Addison-Wesley Publishing Co., 1985, pp. 281-282.
Hodges et al., *Analysis and Design of Digital Integrated Circuits*, McGraw-Hill Book, co., 1983, pp. 335-337.

Primary Examiner—Timothy P. Callahan
Assistant Examiner—Dinh Le
Attorney, Agent, or Firm—Koppel & Jacobs

[57] ABSTRACT

An input buffer circuit incorporates variable hysteresis levels to protect against unintended changes of output state in response to glitches in the input signal. The circuit is used in connection with input signals that alternate between LO and HI input states with known minimum periods between alternations. The switching threshold hysteresis for reverting back to a prior output state is boosted during the period following an input signal transition, with the boosted hysteresis removed following a delay period that is no greater than the minimum period between successive input signal transitions. Numerous circuit designs may be used to implement the varying hysteresis levels.

35 Claims, 2 Drawing Sheets

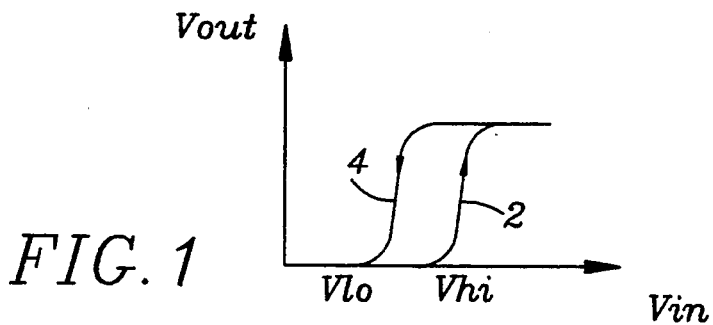
FIG. 1
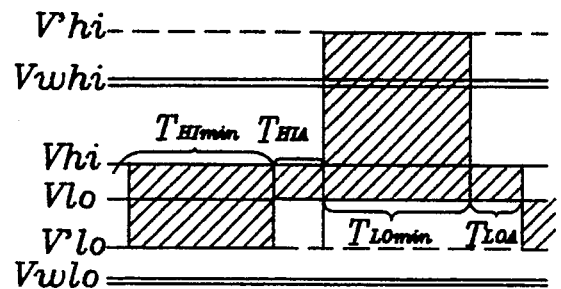
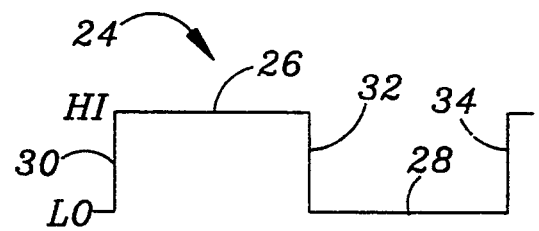
FIG. 4
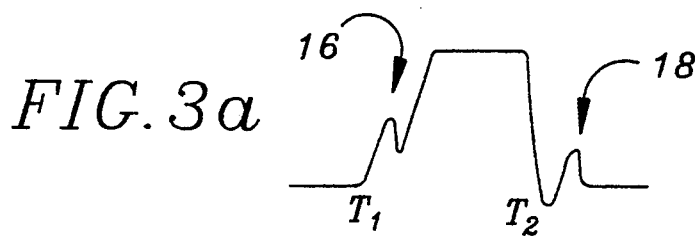
FIG. 3a
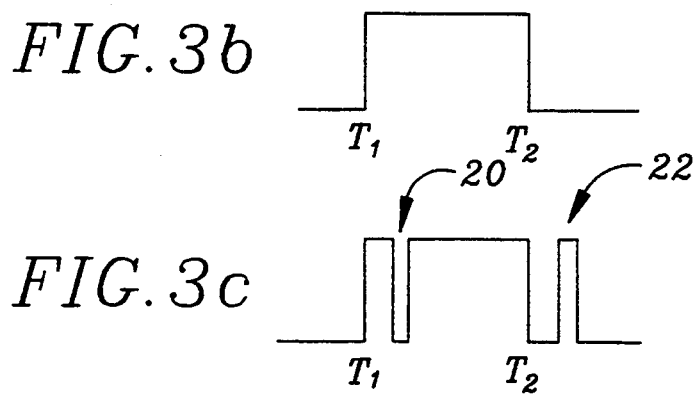
FIG. 3b
FIG. 3c

INPUT BUFFER CIRCUIT WITH DEGLITCH METHOD AND APPARATUS

BACKGROUND OF THE INVENTION

1. Field of the Invention

This invention relates to input buffer circuits for switching an output between HI and LO states when an input signal crosses a threshold level, with a hysteresis function added to prevent unintentional resetting switching of the circuit, and more particularly to Schmitt trigger circuits with a time-variant threshold level.

2. Description of the Related Art

A Schmitt trigger circuit functions as a level-detecting comparator with hysteresis. Its output changes from a LO to a HI state when an increasing input signal crosses an upper switching threshold Vhi, and reverts back to its initial state only when the input crosses a lower threshold level Vlo which is less than Vhi. The difference between the two threshold levels, Vhi-Vlo, is the hysteresis associated with the switch. Schmitt trigger circuits are commonly used on chip inputs to convert a signal with a very slow or sloppy transition into a signal with a sharp transition. They are described, for example, in Glasser et al., *The Design and Analysis Circuits*, Addison-Wesley Publishing Co., 1985, pages 281-282, and in Hodges et al., *Analysis and Design of Digital Integrated Circuits*, McGraw-Hill Book Co., 1983, pages 335-337.

A typical input-output voltage characteristic for a non-inverting Schmitt trigger circuit is illustrated in FIG. 1. The output follows a trace 2 when the input rises above the turn-on threshold Vhi, and then follows trace 4 as the input falls back below the turn-off voltage threshold Vlo.

A schematic diagram of a conventional non-inverting CMOS Schmitt trigger is given in FIG. 2. An input signal is applied at an input terminal 2, and is transmitted via an input N-channel field effect transistor (FET) N0pa ("pa" indicates "prior art") to the switch circuit. An ENABLE terminal 4 provides a power conservation function by applying an ENABLE signal to the gates of input transistor N0pa and an ENABLE PMOS transistor P0pa. The source-drain circuit of transistor P0pa is connected between a positive voltage reference Vdd, typically 5 volts, and the input to the switch circuit. Transistor N0pa is turned on and transistor P0pa is turned off when a HI enable signal is applied at terminal 4, allowing the Schmitt trigger to function in the normal manner. A LO enable signal is applied during periods when the output from the Schmitt trigger is not used. It turns transistor N0pa off and transistor P0pa on, tying the Schmitt trigger input to Vdd and causing it to produce a HI output state regardless of the input signal.

The Schmitt trigger itself includes two P-channel FETs P1pa and P2pa, which have their source-drain current circuits connected in series with the source-drain current circuits of a pair of N-channel FETs N1pa and N2pa. The P-channel end of the series circuit is connected to Vdd, while the N-channel end of the circuit is connected to a lower voltage reference such as ground; the input signal is connected in common at node 6 to the gate control electrodes for each of the series-connected FETs. A third P-channel device P3pa has its source-drain circuit connected between ground and the junction 8 of the P1pa/P2pa current circuits, while a third N-channel device N3pa has its source-drain circuit connected between Vdd and the junction 10 of the current circuits for the N-channel devices N1pa and N2pa. The gate electrodes of P3pa and N3pa are connected together to an internal output line 12 at the junction of the current circuits for P2pa and N1pa, which in turn is connected through an inverter INV1 to an external output terminal 14.

In operation, assume that the input signal at terminal 2 is initially LO, and that the circuit has been enabled. The P-channel devices P1pa and P2pa will thus be ON, while the N-channel devices N1pa and N2pa will be OFF. This ties internal output line 12 to a HI state equal to Vdd, which in turn holds P3pa OFF and N3pa ON to set the node 10 HI (less a threshold voltage). The output at terminal 14 at this time is the inverted value of the signal at node 12, or LO.

Assume now that the input voltage at terminal 2 begins to rise. When the input voltage has become great enough, the N-channel devices N1pa and N2pa will become conductive, while the P-channel devices P1pa and P2pa will turn OFF. When it is conductive, FET N2pa connects node 10 to the ground reference, which in turn grounds the internal output line 12 through N1pa; the result is a HI inverted signal at output terminal 14. However, N2pa has to overcome the connection of Vdd to node 10 (through N3pa) before it can place node 10 in a LO state. The relative size scalings of N1pa, N2pa and N3pa are selected to set the threshold voltage level Vhi at which this transition to a HI output occurs. Conversely, once the trigger circuit output is HI, P3pa is held ON by virtue of its gate's ground connection through N1pa and N2pa, while P1pa and P2pa are held OFF. For the circuit output at terminal 14 to revert to a LO state when the input signal at terminal 2 falls, P1pa must become conductive enough to overcome the grounding effects of P3pa and set node 8 at a HI level that corresponds to Vdd. This is the point at which the circuit switches back to a LO output; the relative sizes of P1pa, P2pa and P3pa are selected so that the switching transition occurs at the threshold voltage level Vlo, thus providing the proper amount of hysteresis.

It is not necessary to have both hysteresis transistors P3pa and N3pa. There will still be a level of hysteresis if only one of these transistors is used, but it will be less than with both transistors present. Since the hysteresis level can be doubled using two transistors of the same size, whereas the size of a single transistor has to be substantially more than doubled to double its hysteresis effect, both transistors P3pa and N3pa are commonly employed.

In practice, the circuit does not switch abruptly from one output state to another at the instant Vhi or Vlo is traversed. Rather, a more gradual switching transition takes place, as indicated by the curvatures at either end of switching traces 2 and 4 in FIG. 1, and the non-vertical slope of the traces in between. Also, the actual switching points are sensitive to variations in the manufacturing process, the ambient temperature and the power supply voltage. Such variations impact both the hysteresis and the circuit's speed, as well as its absolute switching points. Thus, in a practical circuit Vhi and Vlo define the outer limits of the input voltage (the threshold window) beyond which the output state will definitely be either HI or LO. For example, with a Vdd of 5 volts and ground providing the voltage reference levels, typical values for Vhi and Vlo are 2.0 volts and 0.8 volts, whereas the actual designed threshold for switching HI might be 1.5 volts and the threshold for switching LO 1.3 volts. This leaves enough "head room" between the designed switching threshold levels and the outer permissible limits of Vhi and Vlo to allow for process, temperature and power supply variations.

The purpose of the hysteresis between the Vhi and Vlo switching threshold levels is to prevent the circuit from unintentionally switching its output state in response to noise or other signal defects. Such unintentional switching is illustrated in FIGS. 3a, 3b and 3c. FIG. 3a illustrates an input signal that begins rising from a LO to a HI state at time T1, and then begins returning to a LO state at time T2. The pulse's rising edge is shown as having a "glitch" 16, during which the signal level momentarily falls before resuming its rise, with another glitch 18 at the end of its falling edge when it rises back above its LO level. The latter glitch can result, for example, from signal undershoots due to transmission line effects from either the circuit board or the bond wires.

The desired output is shown in FIG. 3b, rising from a LO to a HI state at time T1 and then returning to LO at time T2. If, however, the input signal's rising edge initially rises above Vhi but then momentarily falls back below Vlo during the rising edge glitch 16, the buffer circuit will fail by producing an undesired LO output pulse 20, as illustrated in FIG. 3c. Similarly, if the falling edge glitch 18 arises above Vhi after the circuit has resumed a LO output, the circuit will fail by producing an undesired HI pulse 22 after the input pulse has terminated. The input signal is commonly a periodically alternating signal, such as a clock signal, in which the period between successive alternations is known. With such input signals, the circuit failures illustrated in FIG. 3c can reoccur at each alternation in the input signal.

One approach to overcoming this failure problem would be to simply increase the amount of hysteresis by making P3pa and N3pa larger. However, increasing the hysteresis can move the switching points out of the permissible Vhi-Vlo window under certain combinations of processing, temperature and power supply voltage variations. To leave adequate head room between the design switching levels and the window limits to allow for these factors, the amount of hysteresis that can be designed into the circuit is limited.

SUMMARY OF THE INVENTION

The present invention seeks to provide a new circuit and operating method for inhibiting unintentional switching of a Schmitt trigger circuit, without risk of operating beyond the window limits of Vhi or Vlo. The circuit is intended for use with an alternating input signal, such as a clock signal, that has a known minimum period between alternations.

These goals are accomplished with an input buffer circuit that switches from a LO to a HI output state when an input signal rises through LO and HI threshold levels that are separated by a hysteresis amount, and inhibits a reversion to the LO output state for a temporary delay period following the first switching transition, unless the input signal falls below a boosted LO threshold level that is less than the original LO threshold during this period. The delay period is no greater than the known minimum period between input signal alternations, and after it expires the original LO threshold level is restored. A similar operation is provided for a falling input signal, with the circuit switching from a HI to a LO output state when the input signal falls successively through the original HI and LO threshold levels, followed by a temporary period during which the HI threshold is boosted. Again, the boosted threshold level is removed after a delay period that is no greater than the known minimum period between signal alternations. Since the boosted thresholds are removed before the next input signal alternation can occur, they provide additional protection against unintentional switching during the interval between signal alternations. While the operational threshold levels that are in effect when the input alternations actually occur are held within the permissible threshold window, the boosted threshold levels can extend outside the window.

In this manner fixed threshold levels are established that are within the permissible window, but are temporarily overridden by the boosted threshold levels following an input transition. In a preferred embodiment, the boosted hysteresis level is provided by an additional MOS hysteresis transistor that is scaled larger than the normal hysteresis transistor, and thus provides a larger hysteresis. The original hysteresis transistors are connected in parallel with their respective boosted transistors, and a logic circuit interfaces between a delay circuit and the gates of the boosted transistors to hold the latter devices operational only during the delay periods. Multiple capacitors and inverters are preferably employed for the delay circuit to obtain symmetric delays for both rising and falling input signals. In another embodiment, a separate switch is placed in the source-drain circuit for each boosted hysteresis transistor. The switches are controlled by associated logic circuitry to disable the boosted hysteresis transistors after the desired delay period.

These and further features and advantages of the invention will be apparent to those skilled in the art from the following detailed description, taken together with the accompanying drawings.

BRIEF DESCRIPTION OF THE DRAWINGS

FIG. 1 is a voltage plot of a typical Schmitt trigger operation, described above;

FIGS. 3a, 3b and 3c are respectively diagrams of an input voltage waveform, an idealized Schmitt trigger response and a Schmitt trigger response that has failed due to glitches in the input signal, described above;

FIG. 4 is a voltage diagram that illustrates the variable threshold scheme employed by the invention;

DETAILED DESCRIPTION OF THE INVENTION

Figure 2:
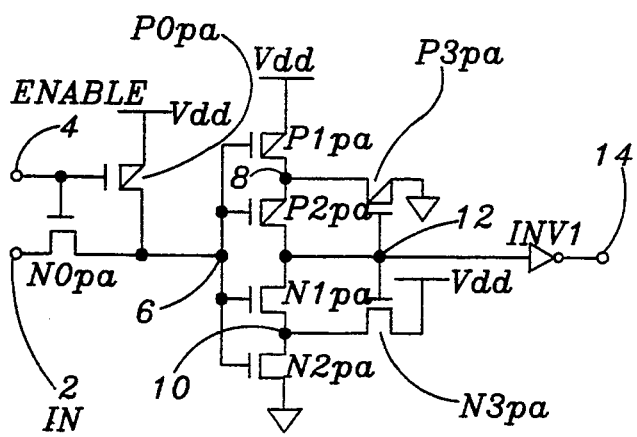
FIG. 2 is a simplified schematic diagram of a prior Schmitt trigger circuit design, described above.

The basic approach taken by the invention to preventing unintentional changes of output state from a Schmitt trigger buffer circuit due to glitches in the input signal is illustrated in FIG. 4. An input signal 24 is shown with a periodic alternation between HI and LO states 26 and 28. Although the input signal 24 is shown as a square wave for simplification, in practice it would normally have noise and other distortions imposed upon it.

Schmitt trigger circuits are commonly used with input signals having a regular periodic variation between HI and LO states over time, such as clock signals. With such signals there is some ambiguity as to the actual pulse durations and intervals between pulses, due to variable process, temperature and power supply factors. However, the clock circuits are designed so that the pulse durations, the intervals between pulses and the overall signal periodicity will at least equal minimum specified durations over specified ranges of these variables. For example, a clock signal may be used in which the duration of each HI pulse is at least 28 nsec, the duration of each LO interval between pulses is at least 28 nsec, and the overall clock period between the beginning of one HI pulse and the beginning of the next HI pulse is at least 80 nsec. Thus, although the exact time characteristics of the clock signal would not normally be known in advance, it would be known that there will be an interval of at least 28 nsec between a rising signal edge and the next falling signal edge, and another interval of at least 28 nsec between the falling signal edge and the following rising edge.

The invention makes use of these known minimum signal time characteristics by substantially increasing the circuit's hysteresis during the period following a signal transition when it is known that another valid transition cannot occur, and then restoring the original smaller hysteresis level so that when the next valid signal transition does occur the circuit's hysteresis is within the acceptable window for switching thresholds.

In the upper portion of FIG. 4, the normal switching thresholds are indicated by Vhi and Vlo, with the normal hysteresis equal to Vhi-Vlo. The upper and lower switching threshold limits that define the permissible switching window are identified as Vwhi and Vwlo, respectively. When the rising edge 30 of the HI input pulse 26 is sensed, the lower threshold level Vlo is switched to a reduced level V'lo. This results in a greater amount of hysteresis, indicated by shading in the figure, between the HI and LO threshold levels Vhi and V'lo. To switch the output back to LO state, the input signal must now drop below V'lo, which would require a considerably greater glitch than when the lower threshold was Vlo. The value of V'lo is selected so that it is far enough below Vhi to prevent all normally expected glitches from triggering a change of output state.

The V'lo threshold level is maintained for a period of time no greater than the minimum time before the arrival of the next valid falling input signal edge at the end of the HI pulse; this time period is indicated as $T_{HImin}$ in the figure. At the end of this period the lower threshold level reverts to Vlo, and remains there until the following input signal edge at the end of the HI pulse arrives. Thus, a normal hysteresis level prevails for the active period during which valid switching can take place, depending upon the actual duration of the HI signal beyond its minimum period. This active switching period for the HI signal is identified in the figure as $T_{HIA}$. When the HI pulse's falling edge 32 does arrive, the lower switching threshold remains at Vlo but the upper threshold increases to a higher level V'hi, and remains at its boosted level for a period up to but no greater than the minimum duration for the LO input signal state $T_{LOmin}$. During this period the boosted hysteresis prevents the circuit from unintentionally triggering to a HI output. The Vhi threshold level is restored at the end of this minimum period $T_{LOmin}$, and continues in effect through the remainder of the active switching period $T_{LOA}$ until the arrival of the rising edge 34 of the next HI pulse.

In this manner, unintentional triggering is inhibited for the majority of the circuit's operation, particularly during and immediately after the critical rising and falling pulse edges, and yet a normal hysteresis level prevails during all times when a valid input signal transition can be expected, thus enabling a rapid response to the transition. Either one or both of the boosted threshold levels V'lo and Vhi can extend beyond the respective threshold window limits Vwlo and Vwhi, if desired. This is permissible because the window establishes the threshold limits for valid switching, and by definition no valid switching can occur during the boosted hysteresis periods. The system thus prevents unintentional changes of output state due to glitches in the input signal, and yet does not interfere with valid switching.

Figure 5:
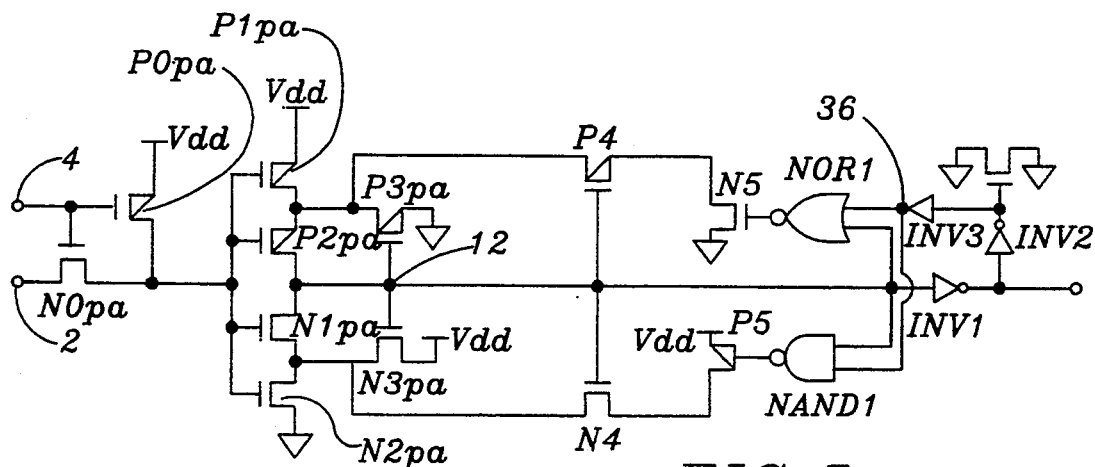
FIG. 5 is a schematic diagram showing one embodiment of the invention that can be used to prevent a Schmitt trigger from responding to unintentional glitches in the input signal.

One circuit that can be used to implement this glitch protection function is shown in FIG. 5. This circuit builds upon the basic Schmitt trigger circuit of FIG. 2, and uses the same reference numerals to identify the same elements. In addition, a PMOS transistor P4 has it source-drain circuit connected between node 8 and NMOS switching transistor N5, while an additional NMOS transistor N4 has its source-drain circuit connected between node 10 and a switching PMOS transistor P5. P4 and N4 are scaled substantially larger than P3pa and N3pa to provide the boosted V'hi and V'lo hysteresis levels, respectively, with the gate of each device connected to the internal output line 12. They are switched into and out of the circuit by the switch transistors N5 and P5, which have their source-drain circuits connected between P4 and N4 to ground and Vdd, respectively. The gates of N5 and P5 are controlled by logic circuits that turn them on, allowing their associated boosted hysteresis transistors P4 and N4 to conduct during the boosted hysteresis periods $T_{LOmin}$ and $T_{HImin}$, respectively. At all other times the transistors N5 and P5 are off and prevent their hysteresis transistors P4 and N4 from conducting, thus rendering them inactive.

A second inverter INV2 at the output of INV1 provides an input signal for a timing circuit 36. With CMOS technology the timing circuit is conveniently implemented by an NMOS transistor that has its source and drain tied to ground to function as one plate of a capacitor, with its gate serving as the other plate and the gate insulation as the capacitor dielectric. When $T_{HImin}$ is equal to $T_{LOmin}$, a single delay circuit 36 can be used to provide equal periods for V'lo and V'hi; separate delay circuits would be used for each boosted hysteresis level if their durations were different.

A NOR gate at NOR1 is provided to control the gate of transistor N5, while a NAND gate NAND1 is provided to control the gate of P5. Each of these gates receives an input from internal output line 12, and another input from the timing circuit 36 that has been inverted by inverter INV3. At the beginning of a HI pulse, the signal on output line 12 goes LO and is applied to both of the logic gates. However, because of the delay associated with delay circuit 36, the other inputs to the logic gates remain HI.

While it offers effective protection against input glitches, the circuit of FIG. 5 is not optimum. Each device connected to the internal output line 12 adds a capacitive factor which, in the aggregate, can slow down the circuit's response to a change in the input signal. In the FIG. 5 circuit there are six such devices connected to the internal output line (P3pa, N3pa, P4, N4, NOR1 and NAND1). Also, taking the input to the delay circuit from the output terminal 14 makes the delay circuit vulnerable to capacitive effects from the output load, which if strong enough can change the delay period. It would be better to isolate the delay circuit from the output load.

Figure 6:
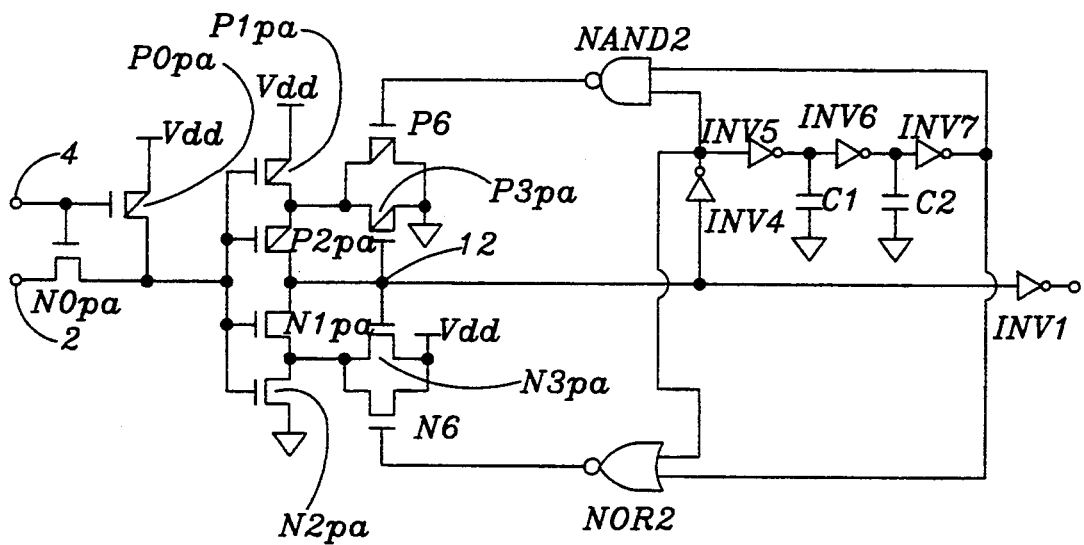
FIG. 6 is a schematic diagram of an improved embodiment of the invention that achieves a faster operation.

An improved circuit is shown in FIG. 6 that addresses both of these problems. In this circuit, boosted hysteresis transistors P6 and N6 are connected with their source-drain circuits in parallel with the source-drain circuits of P3pa and N3pa, respectively. Control signals are applied to the gates of P6 and N6 to turn them ON during their respective boosted hysteresis periods, and to hold them OFF at other times.

Logic switching circuits for P6 and N6 include a NAND gate NA3D2 having its output connected to the gate of P6, and a NOR gate NOR2 having its output connected to the gate of N6. Each of these logic gates receives an input from an inverter INV4 that inverts the signal on internal output line 12. The delay circuit preferably consists of a pair of series-connected inverters INV5 and INV6, with charging capacitors C1 and C2 connected to their respective outputs. (Although a single inverter and capacitor could be used, two capacitors and two inverters are preferable so that symmetric delays are achieved for rising and falling input signals. Each inverter includes a pair of PMOS and NMOS transistors, which in practice are generally not precisely matched; a pair of inverters is used in the delay circuit to balance the P and N devices.) A third inverter INV7 is provided at the output of INV6 to sharpen the edges of the delay signal, which otherwise would rise and fall relatively slowly because of the capacitors. The output from INV7 is applied to the second inputs of the NAND2 and NOR2 gates.

In operation, a transition from a HI to a LO state on internal output line 12 produces HI inputs to NAND2 and NOR2 from INV4. The other input to these gates from INV7 was HI immediately before the input signal transition, and remains HI because of the delay circuit. As a result, NAND2 and NOR2 both produce LO outputs which set P6 ON and N6 OFF, reducing the lower threshold level to V'lo. At the end of the delay period, the second input to both logic gates goes LO, causing NAND2 to change state and turn P6 OFF while leaving NOR2 in the same state holding N6 OFF. When the input signal thereafter falls back to a LO state, setting the internal output line 12 HI, the logic gates receive LO signals from both INV4 and INV7. This sets both NAND2 and NOR2 HI, holding P6 OFF and N6 ON and boosting the HI threshold level to V'hi. After the delay period the output of NAND2 remains HI while the output of NOR2 goes LO, holding both P6 and N6 OFF and restoring the original hysteresis level Vhi-Vlo.

The FIG. 6 circuit thus functions in the manner illustrated in FIG. 4, and yet reduces the number of devices connected to the internal output line 12 by half compared to the FIG. 5 circuit. Furthermore, it avoids having to connect any logic or delay elements to the output terminal 14.

The absolute threshold and hysteresis levels that are achieved depend upon the device scalings. In one implementation of the FIG. 6 circuit Vhi was 1.5 volts, Vlo was 1.3 volts, V'hi was 2.1 volts and V'lo was 0.9 volts (all approximate). These threshold levels were achieved with C1 and C1 capacitances of 0.5 pf each and the following device scalings, in which the first and second digits respectively indicate the transistor widths and lengths in microns:

| P0pa | 3:1 | N0pa | 6:1 |
|---|---|---|---|
| P1pa | 6:1.5 | N1pa | 18:1.5 |
| P2pa | 6:1.5 | N2pa | 18:1.5 |
| P3pa | 4.5:1.5 | N3pa | (not used) |
| P6pa | 20:1.5 | N6pa | 6:1.5 |

The widths of each of the devices in the inverters and logic gates as 3 microns except for INV1 and INV4, for which the widths were 6 microns and 4.5 microns, respectively.

Although FIG. 6 represents the preferred embodiment, it is not absolutely necessary to use all of the hysteresis elements shown in this circuit. For example, consider that the base hysteresis level Vhi-Vlo is established by P3pa and N3pa. Even if N3pa were eliminated, P3pa would still establish a base hysteresis, although it would be half that established by P3pa and N3pa acting together (assuming the two transistors had equal scalings). While the original base hysteresis magnitude could be recaptured by scaling P3pa larger, the hysteresis level increases less than linearly with transistor size, and a much larger P3pa would be required. Since it becomes more difficult to control the circuit operation when the scalings of different transistors differ by significant amounts, dividing the base hysteresis function between the two transistors P3pa and N3pa is generally preferable.

A more extreme variation would be to eliminate both P3pa and N3pa. This would not significantly effect the boosted hysteresis levels because the parallel combination of P6 and P3pa is dominated by P6 when that device is ON, and similarly for the parallel combination N6 and N3pa. However, eliminating both of the base hysteresis transistors would eliminate all glitch protection during the intervals between the end of the delay period and the next input transition ($T_{HIA}$ and $T_{LOA}$ in FIG. 4).

An even more extreme variation would be to eliminate either P6 or N6, but not both, along with P3pa and N3pa. This would eliminate glitch protection except during the period $T_{HImin}$ or $T_{LOmin}$ of FIG. 4, but there may be circumstances in which it would be acceptable.

While particular embodiments of the invention have been shown and described, numerous variations and alternate embodiments will occur to those skilled in the art. Accordingly, it is intended that the invention be limited only in terms of the appended claims.

I claim:

1. A method of buffering an input signal that alternates between LO and HI input states, with the input signal remaining LO for at least a known minimum period and then remaining HI for at least a known minimum period, comprising:

switching in a first transition from a LO to a HI output state when the input signal rises successively through LO and HI threshold levels, with the HI threshold level exceeding the LO threshold level by a predetermined hysteresis amount, and inhibiting a reversion to said LO output state, for a predetermined fixed delay period following said first transition that is no greater than the minimum duration for a LO input state, unless said input signal falls below a boosted LO threshold level that is less than said LO threshold level, and thereafter inhibiting a reversion to said LO output state unless said input signal falls below said LO threshold level.

2. The method of claim 1, further comprising the steps of:

switching in a second transition from said HI to said LO output state when the input signal falls successively through said HI and LO threshold levels, inhibiting a reversion to said HI output state, for a predetermined fixed delay period following said second transition that is no greater than the minimum duration for a HI input state, unless said input signal rises above a boosted HI threshold level that is greater than said HI threshold level, and thereafter inhibiting a reversion to said HI output state unless said input signal rises above said HI threshold level.

3. The method of claim 2, wherein the delay periods following said first and second transitions are equal.

4. The method of claim 2, wherein said HI and LO threshold levels are restricted to a predetermined window of threshold levels over predetermined process, temperature and power supply ranges, and said boosted HI and boosted LO threshold levels are outside are window.

5. In a Schmitt trigger circuit that includes means for switching from a LO to a HI output state in response to an input signal rising above a HI threshold level, and means for switching from a HI to a LO output state in response to the input signal falling below a LO threshold level that is offset by a hysteresis amount below said HI threshold level, the improvement comprising:

means connected to said LO to HI output state switching means for temporarily increasing said hysteresis amount in response to the input signal initiating an output state transition, and means connected to said means for temporarily increasing said hysteresis amount for terminating said increase in the hysteresis amount after a predetermined fixed delay period that is independent of the input signal level.

6. The Schmitt trigger circuit of claim 5, for use with an alternating input signal that remains LO for at least a known minimum period and then remains HI for at least a known minimum period, wherein said fixed predetermined delay period is no greater than said minimum periods.

7. The Schmitt trigger circuit of claim 6, said Schmitt trigger circuit being limited to switching between HI and LO output states at threshold levels that are within a predetermined threshold level window, wherein said HI and LO threshold levels are within said window in the absence of said offset and at least one of said HI and LO threshold levels is outside said window in the presence of said offset.

8. The Schmitt trigger circuit of claim 5, wherein said means for temporarily increasing the hysteresis threshold offset increases said offset for both a transition from a LO to a HI and from a HI to a LO output state.

9. The Schmitt trigger circuit of claim 8, wherein said terminating means terminates said increases in the hysteresis threshold offset after equal delay periods for transitions from LO to HI and from HI to LO output states.

10. The Schmitt trigger circuit of claim 8, wherein the amount of increase in said hysteresis threshold offset is different for a transition from a LO to a HI output state than for a transition from a HI to a LO output state.

11. A buffer circuit for an input signal that alternates between LO and HI input states, with the input signal remaining LO for at least a known minimum period and then remaining HI for at least a known minimum period, comprising:

a conversion circuit for converting said input signal to one of a plurality of output states, including threshold means for converting from a first to a second output state in response to a first transition at which the input signal crosses a first fixed threshold level in a first direction, a first hysteresis circuit connected to said conversion circuit for adjusting said first fixed threshold level, in response to said first transition, to a first transient threshold level that is offset from said first fixed threshold level by a first boosted hysteresis amount in a direction opposite to said first input signal direction, said threshold adjustment preventing a reversion back to said first output state until the input signal has crossed both said first fixed and said first transient threshold levels in said opposite direction, and delay means for disabling said first hysteresis circuit at the end of a first fixed predetermined delay period after said first transition, said first delay period being no greater than the minimum input signal period following said first transition.

12. The buffer circuit of claim 11, further comprising a second hysteresis circuit connected to said conversion circuit, for adjusting said first fixed threshold level, in response to said first transition, to a second fixed threshold level that is offset from said first fixed threshold level in the same direction as, but by a lesser hysteresis amount than, said first transient threshold level, said second hysteresis circuit being substantially continuously operable but overridden by said first hysteresis circuit during said delay period.

13. A buffer circuit for an input signal that alternates between LO and HI input states with the input signal remaining LO for at least a known minimum period and then remaining HI for at least a known minimum period, comprising:

a conversion circuit for converting said input signal to one of a plurality of output states, including threshold means for converting from a first to a second output state in response to a first transition at which the input signal crosses a first fixed threshold level in a first direction, a first hysteresis circuit connected to said conversion circuit for adjusting said first fixed threshold level, in response to said first transition, to a first transient threshold level that is offset from said first fixed threshold level by a first boosted hysteresis amount in a direction opposite to said first input signal direction, said threshold adjustment preventing a reversion back to said first output state until the input signal has crossed both said first and said first transient threshold levels in said opposite direction, delay means for disabling said first hysteresis circuit at the end of a first fixed predetermined delay period after said first transition, said first delay period being no greater than the minimum input signal period following said first transition, and a second hysteresis circuit connected to said conversion circuit for adjusting said first fixed threshold level, in response to said first transition, to a second fixed threshold level that is offset from said first fixed threshold level in the same direction as, but by a lesser hysteresis amount than, said first transient threshold level, said second hysteresis circuit being substantially continuously operable but overridden by said first hysteresis circuit during said delay period, wherein said buffer circuit operates with a predetermined threshold limit to which its conversion threshold level is limited over predetermined process, temperature and power supply ranges, wherein said first and second fixed threshold levels are inside but said first transient threshold level is outside said threshold limit.

14. A buffer circuit for an input signal that alternates between LO and HI input states with the input signal remaining LO for at least a known minimum period and then remaining HI for at least a known minimum period, comprising:

a conversion circuit for converting said input signal to one of a plurality of output states, including threshold means for converting from a first to a second output state in response to a first transition at which the input signal crosses a first fixed threshold level in a first direction, said conversion circuit converting from said second to said first output state in response to a second transition at which the input signal crosses said second fixed threshold level in a direction opposite said first input signal direction, a first hysteresis circuit connected to said conversion circuit for adjusting said first fixed threshold level, in response to said first transition, to a first transient threshold level that is offset from said first fixed threshold level by a first boosted hysteresis amount in a direction opposite to said first input signal direction, said threshold adjustment preventing a reversion back to said first output state until the input signal has crossed both said first fixed and said first transient threshold levels in said opposite direction, delay means for disabling said first hysteresis circuit at the end of a first predetermined delay period after said first transition, said first delay period being no greater than the minimum HI signal period following a first transition from a LO to a HI input state, and no greater than the minimum LO signal period following a first transition from a HI to a LO input state, a second hysteresis circuit connected to said conversion circuit for adjusting said first fixed threshold level, in response to said first transition, to a second fixed threshold level that is offset from said first fixed threshold level in the same direction as, but by a lesser hysteresis amount than, said first transient threshold level, said second hysteresis circuit being substantially continuously operable but overridden by said first hysteresis circuit during said delay period, and a complementary first hysteresis circuit for adjusting said second fixed threshold level, in response to said second transition, to a second transient threshold level by a second boosted hysteresis amount in a direction opposite to said first direction, said second fixed threshold adjustment preventing a reversion back to said second output state until the input signal has crossed both said second fixed and second transient threshold levels in said first direction, and said delay means disabling said complementary first hysteresis circuit at the end of a second fixed predetermined delay period after said second transition, said second delay period being no greater than the minimum LO signal period following a second transition from a HI to LO input state, and no greater than the minimum HI signal period following a second transition from a LO to a HI input state.

15. The buffer circuit of claim 14, further comprising a complementary second hysteresis circuit for adjusting said second fixed threshold level, in response to said second transition, back to said first fixed threshold level, said complementary second hysteresis circuit being substantially continuously operable but overridden by said complementary first hysteresis circuit during said second delay period.

16. The buffer circuit of claim 15, said buffer circuit operating within a predetermined window of threshold levels to which its first and second transition levels are limited over predetermined process, temperature and power supply ranges, wherein said first and second fixed threshold levels are inside but said first and second transient threshold levels are outside said window.

17. The buffer circuit of claim 15, wherein said delay means provides substantially equal first and second delay periods.

18. A Schmitt trigger circuit, comprising:

an input terminal for receiving an input signal that alternates between LO and HI input states with the input signal remaining LO for at least a known minimum period and then remaining HI for at least a known minimum period, an internal output line, a pair of PMOS trigger transistors connected with their source-drain circuits in series between a high voltage reference and said internal output line, a pair of NMOS trigger transistors connected with their source-drain circuits in series between said internal output line and a low voltage reference, means for applying an input signal at said input terminal to the gates of said PMOS and NMOS trigger transistors, a larger PMOS hysteresis transistor having its source-drain circuit connected between a low voltage reference and the junction of the source-drain circuits of said PMOS trigger transistors, a switch circuit connected to selectively enable or disable current flow through the source-drain circuit of said larger PMOS hysteresis transistor, a larger NMOS hysteresis transistor having its source-drain circuit connected between a high voltage reference and the junction of the source-drain circuits of said NMOS trigger transistors, a switch circuit connected to selectively enable or disable current flow through the source-drain circuit of said larger NMOS hysteresis transistor, a smaller hysteresis transistor means having a source-drain circuit connected between a voltage reference and the junction of the source-drain circuits of at least one of said pairs of trigger transistors, and its gate connected to said internal output line, said smaller hysteresis transistor means being smaller than said larger hysteresis transistors and providing a lower level of hysteresis, a delay circuit for generating a predetermined fixed delay period in response to the Schmitt trigger circuit switching HI or LO, said delay period being no greater than said known minimum HI signal period following the Schmitt trigger circuit switching HI, and no greater than said known minimum LO signal period following the Schmitt trigger circuit switching LO, said delay circuit controlling said switch circuits to disable current flow through the source-drain circuit of said larger PMOS hysteresis transistor at the end of said delay period after the Schmitt trigger circuit has switched HI, and to disable current flow through the source-drain circuit of said larger NMOS hysteresis transistor at the end of said delay period after the Schmitt trigger circuit has switched LO, and an inverter connected to said internal output line to provide a Schmitt trigger output.

19. The Schmitt trigger circuit of claim 18, said smaller hysteresis transistor means comprising:

a smaller PMOS hysteresis transistor having its source-drain circuit connected between a low voltage reference and the junction of said PMOS trigger transistors, and its gate connected to said internal output line, said smaller PMOS hysteresis transistor being smaller than said larger PMOS hysteresis transistor and providing a lower level of hysteresis than said larger PMOS hysteresis transistor when the Schmitt trigger circuit has switched HI, and a smaller NMOS hysteresis transistor having its source-drain circuit connected between a high voltage reference and the junction of said NMOS trigger transistors, and its gate connected to said internal output line, said smaller NMOS hysteresis transistor being smaller than said larger NMOS hysteresis transistor and providing a lower level of hysteresis than said larger NMOS hysteresis transistor when the Schmitt trigger circuit has switched LO.

20. The Schmitt trigger circuit of claim 19, wherein said larger PMOS and NMOS hysteresis transistors have their source-drain circuits connected in parallel with the source-drain circuits of said smaller PMOS and NMOS hysteresis transistors, respectively, and the switch circuits for said larger PMOS and NMOS hysteresis transistors are connected to apply enabling and disabling signals to the gates of their respective larger hysteresis transistors.

21. The Schmitt trigger circuit of claim 20, said switch circuits including respective NAND or NOR gates connected to receive inputs from said internal output line and from said delay circuit to control the switching states of the switch circuits.

22. The Schmitt trigger circuit of claim 21, said switch circuits for said larger PMOS hysteresis transistor comprising a NAND gate that is connected to receive an inverted input from said internal output line and a noninverted input from said delay circuit, and has its output connected to the gate of said larger PMOS hysteresis transistor.

23. The Schmitt trigger circuit of claim 21, said switch circuits for said larger NMOS hysteresis transistor comprising a NOR gate that is connected to receive an inverted input from said internal output line and a noninverted input from said delay circuit, and has its output connected to the gate of said larger NMOS hysteresis transistor.

24. A Schmitt trigger circuit, comprising:

an input terminal for receiving an input signal that alternates between LO and HI input states with the input signal remaining LO for at least a known minimum period and then remaining HI for at least a known minimum period, an internal output line, a pair of PMOS trigger transistors connected with their source-drain circuits in series between a high voltage reference and said internal output line, a pair of NMOS trigger transistors connected with their source-drain circuits in series between said internal output line and a low voltage reference, means for applying an input signal at said input terminal to the gates of said PMOS and NMOS trigger transistors, a larger PMOS hysteresis transistor having its source-drain circuit connected between a low voltage reference and the junction of the source-drain circuits of said PMOS trigger transistors, a switch circuit connected to selectively enable or disable current flow through the source-drain circuit of said larger PMOS hysteresis transistor, a larger NMOS hysteresis transistor having its source-drain circuit connected between a high voltage reference and the junction of the source-drain circuits of said NMOS trigger transistors, a switch circuit connected to selectively enable or disable current flow through the source-drain circuit of said larger NMOS hysteresis transistor, a smaller hysteresis transistor means having a source-drain circuit connected between a voltage reference and the junction of the source-drain circuits of at least one of said pairs of trigger transistors, and its gate connected to said internal output line, said smaller hysteresis transistor means being smaller than said larger hysteresis transistors and providing a lower level of hysteresis, a delay circuit for generating a predetermined fixed delay period in response to the Schmitt trigger circuit switching HI or LO, said delay period being no greater than said known minimum HI signal period following the Schmitt trigger circuit switching HI, and no greater than said known minimum LO signal period following the Schmitt trigger circuit switching LO, said delay circuit controlling said switch circuits to disable current flow through the source-drain circuit of said larger PMOS hysteresis transistor at the end of said delay period after the Schmitt trigger circuit has switched HI, and to disable current flow through the source-drain circuit of said larger NMOS hysteresis transistor at the end of said delay period after the Schmitt trigger circuit has switched LO, and an inverter connected to said internal output line to provide a Schmitt trigger output, said smaller hysteresis transistor means comprising:

a smaller PMOS hysteresis transistor having its source-drain circuit connected between a low voltage reference and the junction of said PMOS trigger transistors, and its gate connected to said internal output line, said smaller PMOS hysteresis transistor being smaller than said larger PMOS hysteresis transistor and providing a lower level of hysteresis than said larger PMOS hysteresis transistor when the Schmitt trigger circuit has switched HI, and a smaller NMOS hysteresis transistor having its source-drain circuit connected between a high voltage reference and the junction of said NMOS trigger transistors, and its gate connected to said internal output line, said smaller NMOS hysteresis transistor being smaller than said larger NMOS hysteresis transistor and providing a lower level of hysteresis than said larger NMOS hysteresis transistor when the Schmitt trigger circuit has switched LO, said larger PMOS and NMOS hysteresis transistors having their source-drain circuits connected in parallel with the source-drain circuits of said smaller PMOS and NMOS hysteresis transistors, respectively, and the switch circuits for said larger PMOS and NMOS hysteresis transistors being connected to apply enabling and disabling signals to the gates of their respective larger hysteresis transistors, said switch circuits comprising respective logic negation gates connected to receive inputs from said internal output line and from said delay circuit, and said switch circuit for said larger NMOS hysteresis transistor comprising a NOR gate that is connected to receive an inverted input from said internal output line and a noninverted input from said delay circuit, and has its output connected to the gate of said larger NMOS hysteresis transistor, wherein said delay circuit generates substantially equal delay periods for said Schmitt trigger circuit switching.

25. The Schmitt trigger circuit of claim 24, wherein a common inverter is used to provide the inverted input signals for said NAND and NOR gates, and said delay circuit is also connected to receive an input from said common inverter, said delay circuit comprising in sequence from said common inverter a first inverter, a first charging capacitor connected between the output of the first inverter and a ground reference, a second inverter, a second charging capacitor connected between the output of the second inverter and said ground reference, and a third inverter.

26. A Schmitt trigger circuit, comprising:
an input terminal for receiving an input signal that alternates between LO and HI input states with the input signal remaining LO for at least a known minimum period and then remaining HI for at least a known minimum period,
an internal output line,
a pair of PMOS trigger transistors connected with their source-drain circuits in series between a high voltage reference and said internal output line,
a pair of NMOS trigger transistors connected with their source-drain circuits in series between said internal output line and a low voltage reference,
means for applying an input signal at said input terminal to the gates of said PMOS and NMOS trigger transistors,
a larger PMOS hysteresis transistor having its source-drain circuit connected between a low voltage reference and the junction of the source-drain circuits of said PMOS trigger transistors,
a switch circuit connected to selectively enable or disable current flow through the source-drain circuit of said larger PMOS hysteresis transistor, a larger NMOS hysteresis transistor having its source-drain circuit connected between a high voltage reference and the junction of the source-drain circuits of said NMOS trigger transistors,
a switch circuit connected to selectively enable or disable current flow through the source-drain circuit of said larger NMOS hysteresis transistor,
a smaller hysteresis transistor means having a source-drain circuit connected between a voltage reference and the junction of the source-drain circuits of at least one of said pairs of trigger transistors, and its gate connected to said internal output line, said smaller hysteresis transistor means being smaller than said larger hysteresis transistors and providing a lower level of hysteresis,
a delay circuit for generating a predetermined fixed delay period in response to the Schmitt trigger circuit switching HI or LO, said delay period being no greater than said known minimum HI signal period following the Schmitt trigger circuit switching HI, and no greater than said known minimum LO signal period following the Schmitt trigger circuit switching LO, said delay circuit controlling said switch circuits to disable current flow through the source-drain circuit of said larger PMOS hysteresis transistor at the end of said delay period after the Schmitt trigger circuit has switched HI, and to disable current flow through the source-drain circuit of said larger NMOS hysteresis transistor at the end of said delay period after the Schmitt trigger circuit has switched LO, and
an inverter connected to said internal output line to provide a Schmitt trigger output,
wherein said larger PMOS and NMOS hysteresis transistors have their gates connected to said internal output line, with their respective switch circuits connected in their source-drain circuits.

27. The Schmitt trigger circuit of claim 26, said switch circuits for said larger PMOS and NMOS hysteresis transistors comprising respective NMOS and PMOS switch transistors having their source-drain circuits connected in the source drain circuits for their respective larger hysteresis transistors, and respective logic circuits interfacing between said delay circuit and the gates of their respective switch transistors.

28. The Schmitt trigger circuit of claim 27, the logic circuit for each switch circuit comprising a respective negation gate connected to receive inputs from said internal output line and from said delay circuit, and to provide control signals to the gate of its respective switch transistor.

29. The Schmitt trigger circuit of claim 28, wherein the logic circuits for said NMOS and PMOS switch transistors respectively comprise a NOR gate and a NAND gate connected to receive noninverted inputs from said internal output line and inverted inputs from said delay circuit, and having their outputs connected to the gates of their respective switch transistors.

30. A method of buffering an input signal that alternates between LO and HI input states, with the input signal remaining LO for at least a known minimum period and then remaining HI for at least a known minimum period, comprising:
switching in a first transition from a LO to a HI output state when the input signal rises successively through LO and HI threshold levels, with the HI threshold level exceeding the LO threshold level by a predetermined hysteresis amount, and inhibiting a reversion to said LO output state, for a delay period following said first transition that is no greater than the minimum period between a LO and a succeeding HI input state, unless said input signal falls below a boosted HI threshold level that is less than said LO threshold level, enabling a reversion to said LO output state during said delay period in response to said input signal falling below said boosted LO threshold level, and thereafter inhibiting a reversion to said LO output state unless said input signal falls below said LO threshold level.

31. The method of claim 30, further comprising the steps of:

switching in a second transition from said HI to said LO output state when the input signal falls successively through said HI and LO threshold levels, inhibiting a reversion to said HI output state, for a delay period following said second transition that is no greater than the minimum period between a HI and a succeeding LO input state, unless said input signal rises above a boosted HI threshold level that is greater than said HI threshold level, enabling a reversion to said HI output state during said delay period following said second transition in response to said input signal rising above said boosted HI threshold level, and thereafter inhibiting a reversion to said HI output state unless said input signal rises above said HI threshold level.

32. The method of claim 31, wherein the delay periods following said first and second transitions are equal.

33. The method of claim 31, wherein said HI and LO threshold levels are restricted to a predetermined window of threshold levels over predetermined process, temperature and power supply ranges, and said boosted HI and boosted LO threshold levels are outside said window.

34. The method of claim 1, further comprising the step of enabling a reversion to said LO output state during said delay period in response to said input signal falling below said boosted LO threshold level.

35. The method of claim 2, further comprising the step of enabling a reversion to said HI output state during said delay period following said second transition in response to said input signal rising above said boosted HI threshold level.

* * * * *